United States Patent
Kim et al.

(10) Patent No.: US 10,204,544 B2
(45) Date of Patent: Feb. 12, 2019

(54) DISPLAY PANEL DRIVER AND DISPLAY APPARATUS HAVING THE SAME

(71) Applicant: SAMSUNG DISPLAY CO., LTD., Yongin-si, Gyeonggi-Do (KR)

(72) Inventors: Sung-Hwan Kim, Yongin-si (KR); Jun-Hyun Park, Suwon-si (KR); Kyoung-Ju Shin, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 3 days.

(21) Appl. No.: 15/350,917

(22) Filed: Nov. 14, 2016

(65) Prior Publication Data

US 2017/0323593 A1    Nov. 9, 2017

(30) Foreign Application Priority Data

May 9, 2016  (KR) .......................... 10-2016-0056679

(51) Int. Cl.
| | |
|---|---|
| *G09G 3/20* | (2006.01) |
| *G09G 3/3266* | (2016.01) |
| *G11C 19/28* | (2006.01) |
| *G09G 3/3233* | (2016.01) |

(52) U.S. Cl.
CPC ......... *G09G 3/2092* (2013.01); *G09G 3/3266* (2013.01); *G11C 19/28* (2013.01); *G09G 3/3233* (2013.01); *G09G 2310/027* (2013.01); *G09G 2310/0267* (2013.01); *G09G 2310/0286* (2013.01); *G09G 2310/0289* (2013.01)

(58) Field of Classification Search
CPC ......... G09G 3/2092; G09G 2310/0289; G09G 2310/0267; G09G 2310/027
See application file for complete search history.

(56) References Cited

U.S. PATENT DOCUMENTS

| | | | | |
|---|---|---|---|---|
| 2001/0041489 | A1* | 11/2001 | Takeuchi ............... | G02B 26/02 445/24 |
| 2006/0077140 | A1* | 4/2006 | Kwon .................. | G09G 3/3283 345/77 |
| 2007/0222737 | A1* | 9/2007 | Kimura ................ | G09G 3/3266 345/100 |
| 2007/0262929 | A1* | 11/2007 | Kim ....................... | G09G 3/006 345/76 |
| 2008/0170064 | A1* | 7/2008 | Lee ....................... | G09G 3/3677 345/214 |
| 2009/0051628 | A1* | 2/2009 | Kwon .................. | G09G 3/3233 345/77 |
| 2010/0283715 | A1* | 11/2010 | Kretz ....................... | G09G 3/20 345/100 |
| 2011/0148830 | A1* | 6/2011 | Hsu ...................... | G09G 3/3266 345/205 |

(Continued)

FOREIGN PATENT DOCUMENTS

| | | |
|---|---|---|
| KR | 1020080062910 | 7/2008 |
| KR | 1020150059604 | 6/2015 |
| KR | 1020150077896 | 7/2015 |

*Primary Examiner* — Andrew Sasinowski
(74) *Attorney, Agent, or Firm* — F. Chau & Associates, LLC

(57) ABSTRACT

A display panel driver includes a plurality of stages. An N-th stage of the plurality of stages is configured to output a scan signal and an emission signal synchronized with each other based on a first power voltage, a second power voltage, and at least one clock signal. N is a natural number.

20 Claims, 10 Drawing Sheets

(56) References Cited

U.S. PATENT DOCUMENTS

2015/0170568 A1\* 6/2015 Lee ...................... G09G 3/3233
  345/690
2017/0116925 A1\* 4/2017 Lee ...................... G09G 3/3225

\* cited by examiner

DISPLAY PANEL DRIVER AND DISPLAY APPARATUS HAVING THE SAME

CROSS-REFERENCE TO RELATED APPLICATION

This application claims priority under 35 U.S.C. § 119 to Korean Patent Application No. 10-2016-0056679, filed on May 9, 2016 in the Korean Intellectual Property Office KIPO, the disclosure of which is incorporated by reference herein in its entirety.

TECHNICAL FIELD

Exemplary embodiments of the inventive concept relate to a display panel driver and a display apparatus including the display panel driver. More particularly, exemplary embodiments of the inventive concept relate to a display panel driver outputting both a scan signal and an emission signal and a display apparatus including the display panel driver.

DISCUSSION OF RELATED ART

A display apparatus includes a display panel, a timing controller, a scan driver, an emission driver, a data driver, and a power generating unit.

The timing controller controls driving timings of the scan driver, the emission driver, and the data driver. The scan driver generates a scan signal and outputs the scan signal to the display panel. The emission driver generates an emission signal and outputs the emission signal to the display panel. The data driver generates a data voltage and outputs the data voltage to the display panel. The power generating unit generates a power voltage and outputs the power voltage to the display panel.

A conventional display panel includes the scan driver to generate the scan signal and the emission driver to generate the emission signal. The scan driver and the emission driver are independently formed and thus may occupy a large area of dead space in the display panel and consume a high amount of power.

SUMMARY

According to an exemplary embodiment of the inventive concept, a display panel driver includes a plurality of stages. An N-th stage of the plurality of stages is configured to output a scan signal and an emission signal synchronized with each other based on a first power voltage, a second power voltage, and at least one clock signal. N is a natural number.

The display panel driver may be connected to a display panel including a plurality of pixel rows. The scan signal is an N-th scan signal to drive an N-th pixel row and the emission signal is a previous emission signal to drive one of previous pixel rows with respect to the N-th pixel row.

The previous emission signal may be an (N−2)-th emission signal to drive an (N−2)-th pixel row.

The N-th stage may include a first control part configured to transmit a first previous scan signal to a scan control node in response to the first previous scan signal, a second control part configured to transmit the first power voltage to the scan control node in response to a next scan signal, a first scan output part configured to transmit the at least one clock signal to a scan output node in response to a scan control signal of the scan control node, a second scan output part configured to transmit the first power voltage to the scan output node in response to the next scan signal, a third control part configured to transmit the scan control signal to an emission control node in response to the scan control signal, a fourth control part configured to transmit the first power voltage to the emission control node in response to a second previous scan signal, a first emission output part configured to transmit the second power voltage to an emission output node in response to an emission control signal of the emission control node, and a second emission output part configured to transmit the first power voltage to the emission output node in response to the second previous scan signal. The first previous scan signal is outputted from one of previous stages with respect to the N-th stage. The next scan signal is outputted from one of subsequent stages with respect to the N-th stage. The second previous scan signal is outputted from one of the previous stages with respect to the N-th stage and is different from the first previous scan signal.

The first control part may include a first control switching element and a second control switching element. The first control switching element may include a control electrode and an input electrode to which the first previous scan signal is applied and an output electrode connected to an input electrode of the second control switching element. The second control switching element may include a control electrode to which the second power voltage is applied, the input electrode connected to the output electrode of the first control switching element, and an output electrode connected to the scan control node.

The N-th stage may further include a first capacitor including a first electrode connected to the scan control node and a second electrode connected to the scan output node.

The N-th stage may further include a second capacitor including a first electrode connected to the emission control node and a second electrode to which the first power voltage is applied.

The second previous scan signal may be an (N−3)-th scan signal outputted from an (N−3)-th stage.

The second previous scan signal may be an (N−4)-th scan signal outputted from an (N−4)-th stage.

The N-th stage may further include a first holding part configured to transmit the first power voltage to the scan control node in response to a next emission signal. The next emission signal is outputted from one of the subsequent stages with respect to the N-th stage.

The next emission signal may be an (N+2)-th emission signal outputted from an (N+2)-th stage.

The N-th stage may further include a second holding part configured to transmit the first power voltage to the scan output node in response to a next emission signal. The next emission signal is outputted from one of the subsequent stages with respect to the N-th stage.

The next emission signal may be an (N+2)-th emission signal outputted from an (N+2)-th stage.

The first scan output part may include a first scan output switching element including a control electrode connected to the scan control node, an input electrode to which the at least one clock signal is applied, and an output electrode connected to the scan output node.

The second scan output part may include a second scan output switching element including a control electrode to which the next scan signal is applied, an input electrode to which the first power voltage is applied, and an output electrode connected to the scan output node.

The first emission output part may include a first emission output switching element including a control electrode connected to the emission control node, an input electrode to which the second power voltage is applied, and an output electrode connected to the emission output node.

The second emission output part may include a second emission output switching element including a control electrode to which the second previous scan signal is applied, an input electrode to which the first power voltage is applied, and an output electrode connected to the emission output node.

According to an exemplary embodiment of the inventive concept, a display apparatus includes a display panel configured to display an image, a first driver including a plurality of stages and configured to output a scan signal and an emission signal to the display panel, and a second driver configured to output a data voltage to the display panel. An N-th stage of the plurality of stages of the first driver is configured to output the scan signal and the emission signal synchronized with each other based on a first power voltage, a second power voltage, and at least one clock signal. N is a natural number.

The display panel may include a plurality of pixel rows. The scan signal is an N-th scan signal to drive an N-th pixel row and the emission signal is a previous emission signal to drive one of previous pixel rows with respect to the N-th pixel row.

The N-th stage may include a first control part configured to transmit a first previous scan signal to a scan control node in response to the first previous scan signal, a second control part configured to transmit the first power voltage to the scan control node in response to a next scan signal, a first scan output part configured to transmit the at least one clock signal to a scan output node in response to a scan control signal of the scan control node, a second scan output part configured to transmit the first power voltage to the scan output node in response to the next scan signal, a third control part configured to transmit the scan control signal to an emission control node in response to the scan control signal, a fourth control part configured to transmit the first power voltage to the emission control node in response to a second previous scan signal, a first emission output part configured to transmit the second power voltage to an emission output node in response to an emission control signal of the emission control node, and a second emission output part configured to transmit the first power voltage to the emission output node in response to the second previous scan signal. The first previous scan signal is outputted from one of previous stages with respect to the N-th stage. The next scan signal is outputted from one of subsequent stages with respect to the N-th stage. The second previous scan signal is outputted from one the previous stages with respect to the N-th stage and is different from the first previous scan signal.

According to an exemplary embodiment of the inventive concept, a method of driving a display panel, including a plurality of pixel rows, using a display panel driver, including a plurality of stages, is provided. The method includes applying a clock signal and a power voltage, generating a scan control signal in response to the power voltage and a first scan signal that is outputted from an (N−1)-th stage, transmitting the clock signal, in response to the scan control signal, to a scan output node, wherein a high pulse of the clock signal pulls up a second scan signal of an N-th stage, outputting the second scan signal, generating an emission control signal in response to the scan control signal, transmitting the power voltage, in response to the emission control signal, to an emission output node to pull up an emission signal, and outputting the emission signal. N is a natural number. The second scan signal drives an N-th pixel row and the emission signal drives an (N−2)-th pixel row.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Exemplary embodiments of the inventive concept provide a display panel driver capable of outputting a scan signal and an emission signal synchronized with each other.

Exemplary embodiments of the inventive concept also provide a display apparatus including the display panel driver.

Hereinafter, exemplary embodiments of the inventive concept will be described in detail with reference to the accompanying drawings.

Figure 1:
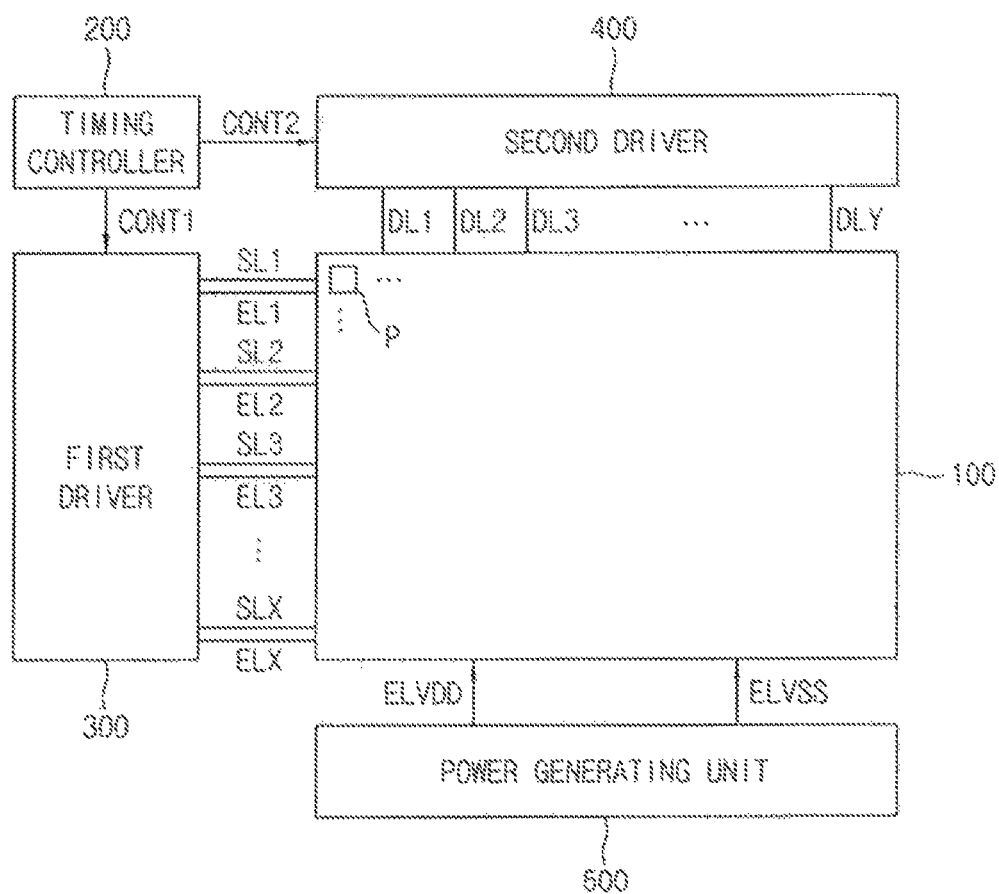
FIG. 1 is a block diagram illustrating a display apparatus according to an exemplary embodiment of the inventive concept.

FIG. 1 is a block diagram illustrating a display apparatus according to an exemplary embodiment of the inventive concept.

Referring to FIG. 1, the display apparatus includes a display panel 100, a timing controller 200, a first driver 300, a second driver 400, and a power generating unit 500. The first driver 300 may be a scan-emission integrated driver outputting both a scan signal and an emission signal. The second driver 400 may be a data driver outputting a data voltage.

In an exemplary embodiment of the inventive concept, the timing controller 200, the first driver 300, the second driver 400, and the power generating unit 500 may be formed in an integrated circuit (IC) chip.

In an exemplary embodiment of the inventive concept, the first driver 300 may be mounted on or integrated in the display panel 100. In addition, the second driver 400 may be mounted on or integrated in the display panel 100.

The display panel 100 displays an image. The display panel 100 includes a plurality of scan lines SL1 to SLX, a plurality of emission lines EL1 to ELX, a plurality of data lines DL1 to DLY, a plurality of subpixels P connected to the scan lines SL1 to SLX, the emission lines EL1 to ELX, and the data lines DL1 to DLY. The subpixels P may be disposed in a matrix form.

In an exemplary embodiment of the inventive concept, the number of the scan lines SL1 to SLX may be X. The number of the emission lines EL1 to ELX may be X. The number of the emission lines EL1 to ELX may be the same as the number of the scan lines SL1 to SLX. On the other hand, the number of the data lines DL1 to DLY may be Y. X and Y are positive integers. In an exemplary embodiment of the inventive concept, the number of the subpixels P may be X*Y. In an exemplary embodiment of the inventive concept, three subpixels may form a pixel so that the number of the pixels may be X*Y/3.

The display panel 100 is connected to the first driver 300 through the scan lines SL1 to SLX and the emission lines EL1 to ELX. The display panel 100 is connected to the second driver 400 through the data lines DL1 to DLY.

The display panel 100 receives a first pixel power voltage ELVDD and a second pixel power voltage ELVSS. The first pixel power voltage ELVDD may be applied to first electrodes of organic light emitting elements of the subpixels P. The second pixel power voltage ELVSS may be applied to second electrodes of the organic light emitting elements of the subpixels P.

The timing controller 200 generates a first control signal CONT1 to control a driving timing of the first driver 300 and outputs the first control signal CONT1 to the first driver 300. The timing controller 200 generates a second control signal CONT2 to control a driving timing of the second driver 400 and outputs the second control signal CONT2 to the second driver 400.

The first driver 300 generates scan signals to drive the scan lines SL1 to SLX and emission signals to drive the emission lines EL1 to ELX, in response to the first control signal CONT1 received from the timing controller 200. The scan signals and the emission signals may be synchronized with each other. The first driver 300 may sequentially output the scan signals to the scan lines SL1 to SLX. The first driver 300 may output the emission signals to the emission lines EL1 to ELX. The operation of the first driver 300 is explained in detail below with reference to FIGS. 2 to 5.

The second driver 400 generates data voltages to drive the data lines DL1 to DLY in response to the second control signal CONT2 received from the timing controller 200. The second driver 400 outputs the data voltages to the data lines DL1 to DLY.

The power generating unit 500 generates the first pixel power voltage ELVDD and the second pixel power voltage ELVSS. The power generating unit 500 provides the first pixel power voltage ELVDD and the second pixel power voltage ELVSS to the display panel 100.

As described above, the first pixel power voltage ELVDD is applied to the first electrodes of the organic light emitting elements of the subpixels P. The second pixel power voltage ELVSS is applied to the second electrodes of the organic light emitting elements of the subpixels P. The first pixel power voltage ELVDD may be greater than the second pixel power voltage ELVSS.

The power generating unit 500 may include a DC-DC converter to generate the first pixel power voltage ELVDD and the second pixel power voltage ELVSS.

The power generating unit 500 may generate driving power voltages required in the first driver 300 and the second driver 400, and may output the driving power voltages to the first driver 300 and the second driver 400.

Figure 2:
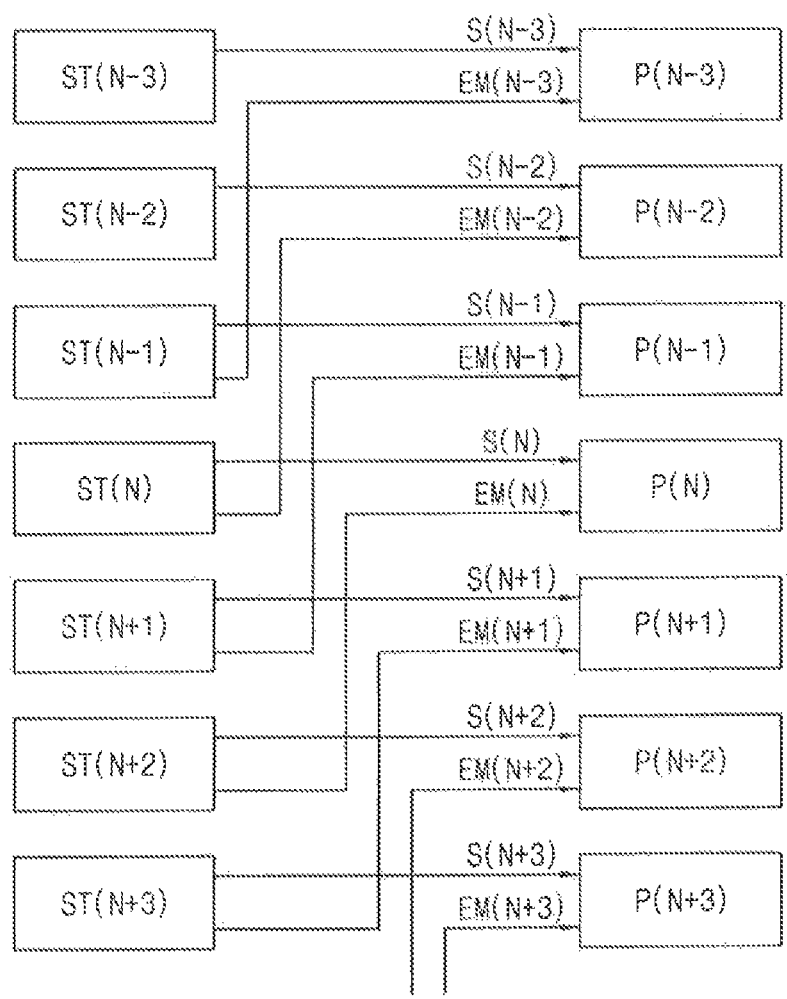
FIG. 2 is a block diagram illustrating stages of a first driver and pixel rows of a display panel of FIG. 1 according to an exemplary embodiment of the inventive concept.
Figure 3:
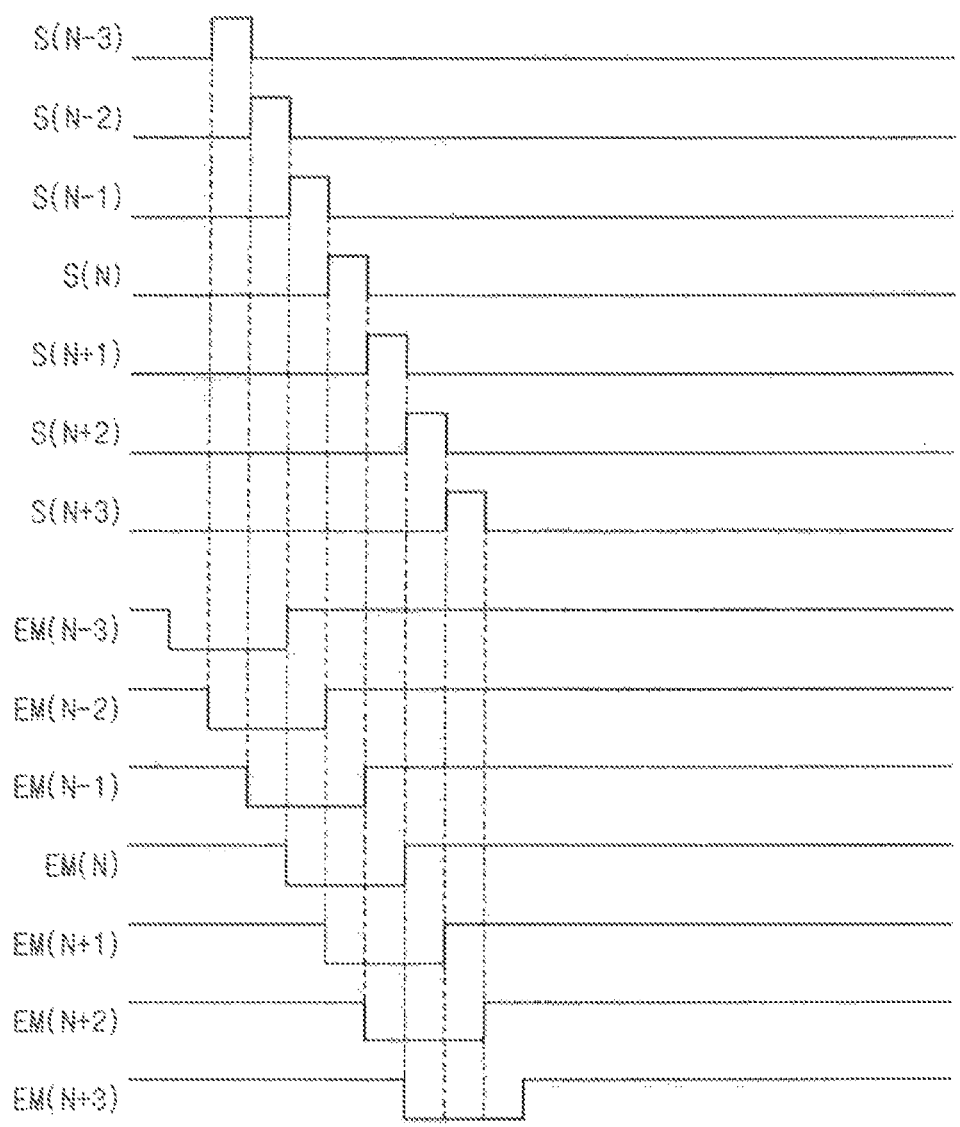
FIG. 3 is a timing diagram illustrating output signals of the first driver of FIG. 1 according to an exemplary embodiment of the inventive concept.

FIG. 2 is a block diagram illustrating stages of the first driver 300 and pixel rows of the display panel 100 of FIG. 1 according to an exemplary embodiment of the inventive concept. FIG. 3 is a timing diagram illustrating output signals of the first driver 300 of FIG. 1 according to an exemplary embodiment of the inventive concept.

Referring to FIGS. 1 to 3, the first driver 300 includes a plurality of stages. FIG. 2 illustrates an N-th stage ST(N), (N−3)-th to (N−1)-th stages ST(N−3) to ST(N−1) which are previous stages of the N-th stage ST(N), and (N+1)-th to (N+3)-th stages ST(N+1) to ST(N+3) which are subsequent stages of the N-th stage ST(N). Herein, N is a positive integer.

The display panel 100 includes a plurality of pixel rows. FIG. 2 illustrates an N-th pixel row P(N) which corresponds to the N-th stage ST(N), (N−3)-th to (N−1)-th pixel rows P(N−3) to P(N−1) which correspond to the (N−3)-th to (N−1)-th stages ST(N−3) to ST(N−1), and (N+1)-th to (N+3)-th pixel rows P(N+1) to P(N+3) which correspond to the (N+1)-th to (N+3)-th stages ST(N+1) to ST(N+3).

The N-th stage ST(N) outputs the scan signal and the emission signal synchronized with each other based on at least one clock signal, a first power voltage and a second power voltage.

The N-th stage ST(N) may output an N-th scan signal to drive the N-th pixel row P(N) and a previous emission signal to drive one of previous pixel rows with respect to the N-th pixel row P(N).

For example, the N-th stage ST(N) may output the N-th scan signal S(N) to drive the N-th pixel row P(N) and an (N−2)-th emission signal EM(N−2) to drive the (N−2)-th pixel row P(N−2).

Similarly, for example, the (N+1)-th stage ST(N+1) may output the (N+1)-th scan signal S(N+1) to drive the (N+1)-th pixel row P(N+1) and an (N−1)-th emission signal EM(N−1) to drive the (N−1)-th pixel row P(N−1).

Similarly, for example, the (N+2)-th stage ST(N+2) may output the (N+2)-th scan signal S(N+2) to drive the (N+2)-th pixel row P(N+2) and an N-th emission signal EM(N) to drive the N-th pixel row P(N).

The scan signals S(N−3) to S(N+3) of the stages may be shifted by a horizontal period from adjacent scan signals. The emission signals EM(N−3) to EM(N+3) of the stages may be shifted by a horizontal period from adjacent emission signals.

When the scan signals S(N−3) to S(N+3) are activated, the data voltages are outputted from the second driver 400 to the subpixels of the display panel 100.

When the emission signals EM(N−3) to EM(N+3) are activated, the organic light emitting elements of the subpixels emit light with luminance corresponding to the data voltages.

In a single pixel row, a deactivated duration of one of the emission signals EM(N−3) to EM(N+3) may include an activated duration of one of the scan signals S(N−3) to S(N+3). For example, a deactivated duration of the N-th emission signal EM(N) may include an activated duration of the N-th scan signal S(N). For example, a deactivated duration of the (N+1)-th emission signal EM(N+1) may include an activated duration of the (N+1)-th scan signal S(N+1). For example, a deactivated duration of the (N+2)-th emission signal EM(N+2) may include an activated duration of the (N+2)-th scan signal S(N+2). The subpixels P of the display panel 100 do not emit light during the activation duration of the scan signals (e.g., S(N−3) to S(N+3)). After the activation duration of a scan signal is finished, the subpixels of the display panel 100 emit light during the activation duration of an emission signal.

In the present exemplary embodiment, switching elements of the display panel 100 are N-type transistors. To turn on the N-type transistors, the scan signals S(N−3) to S(N+3) have driving pulses of a high level. When the scan signals S(N−3) to S(N+3) have the high level, the N-type transistors of the display panel 100 are turned on. When the emission signals EM(N−3) to EM(N+3) have the high level, the N-type transistors of the display panel 100 are turned on. A low level duration of an emission signal may include a high level duration of a scan signal.

For example, a low level duration of the N-th emission signal EM(N) may include a high level duration of the N-th scan signal S(N). For example, a low level duration of the (N+1)-th emission signal EM(N+1) may include a high level duration of the (N+1)-th scan signal S(N+1). For example, a low level duration of the (N+2)-th emission signal EM(N+2) may include a high level duration of the (N+2)-th scan signal S(N+2).

Although the low level duration of the emission signal may be three times the high level duration of the scan signal in the present exemplary embodiment, the inventive concept is not limited thereto.

Although the switching elements of the display panel 100 are N-type transistors in the present exemplary embodiment, the inventive concept is not limited thereto. Alternatively, the switching elements of the display panel 100 may be P-type transistors. When the switching elements of the display panel 100 are P-type transistors, the high level and the low level of the scan signals S(N−3) to S(N+3) and the emission signals EM(N−3) to EM(N+3) in FIG. 3 may be inverted.

Figure 4:
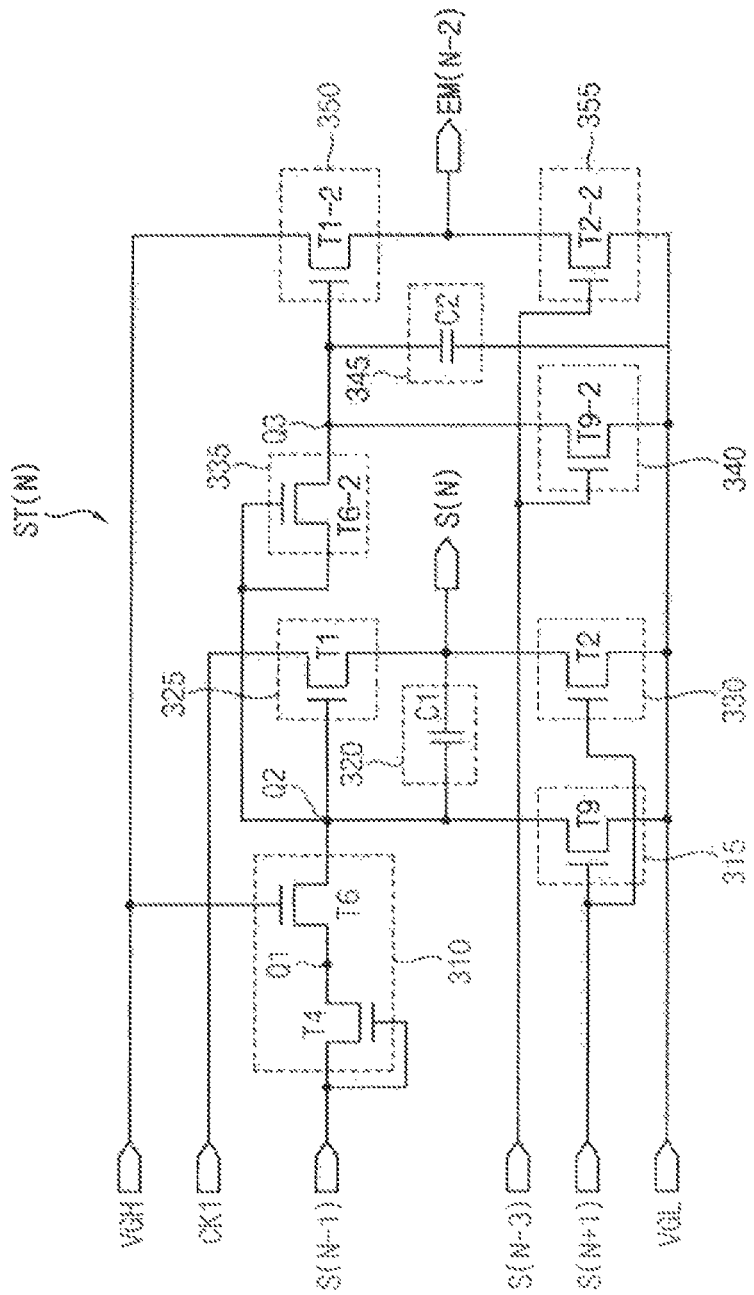
FIG. 4 is a circuit diagram illustrating an N-th stage of the first driver of FIG. 1 according to an exemplary embodiment of the inventive concept.
Figure 5:
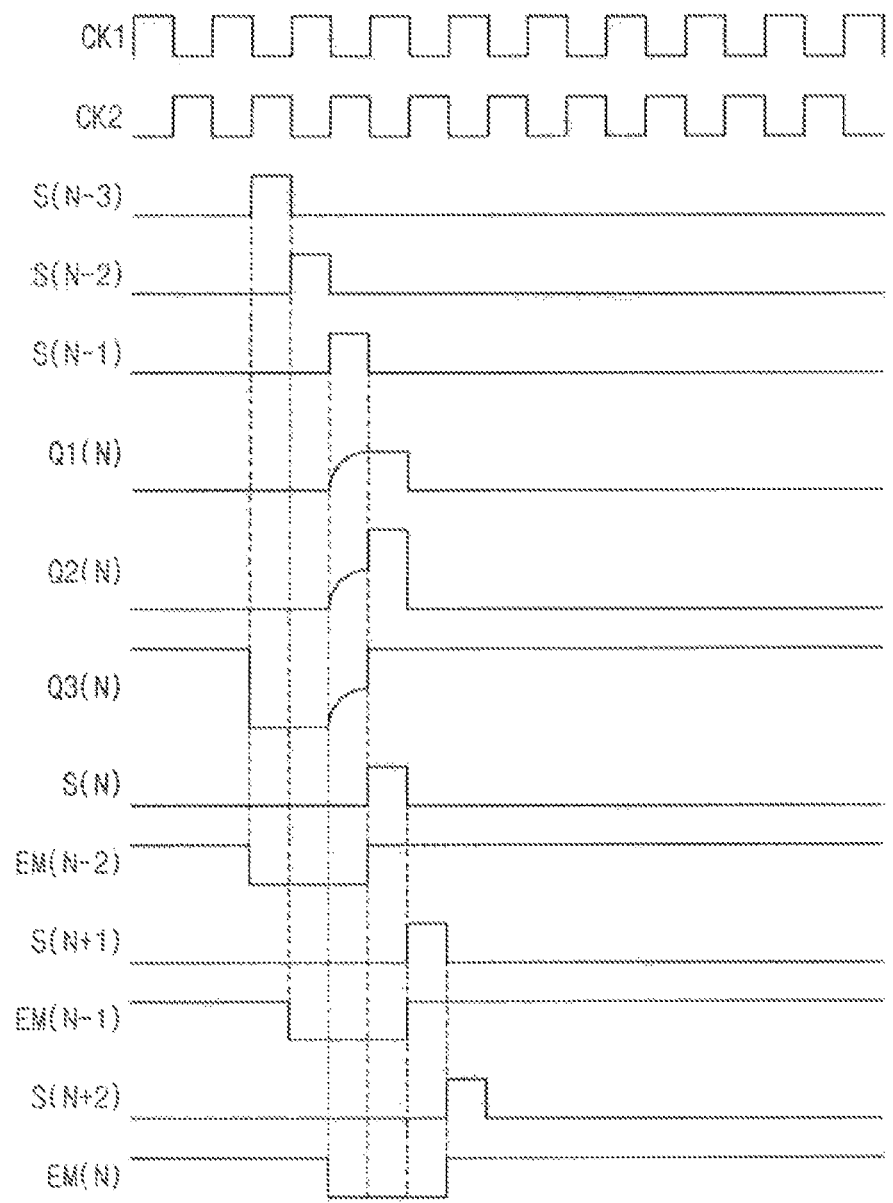
FIG. 5 is a timing diagram illustrating input signals, control signals, and output signals of the first driver of FIG. 1 according to an exemplary embodiment of the inventive concept.
Figure 6:
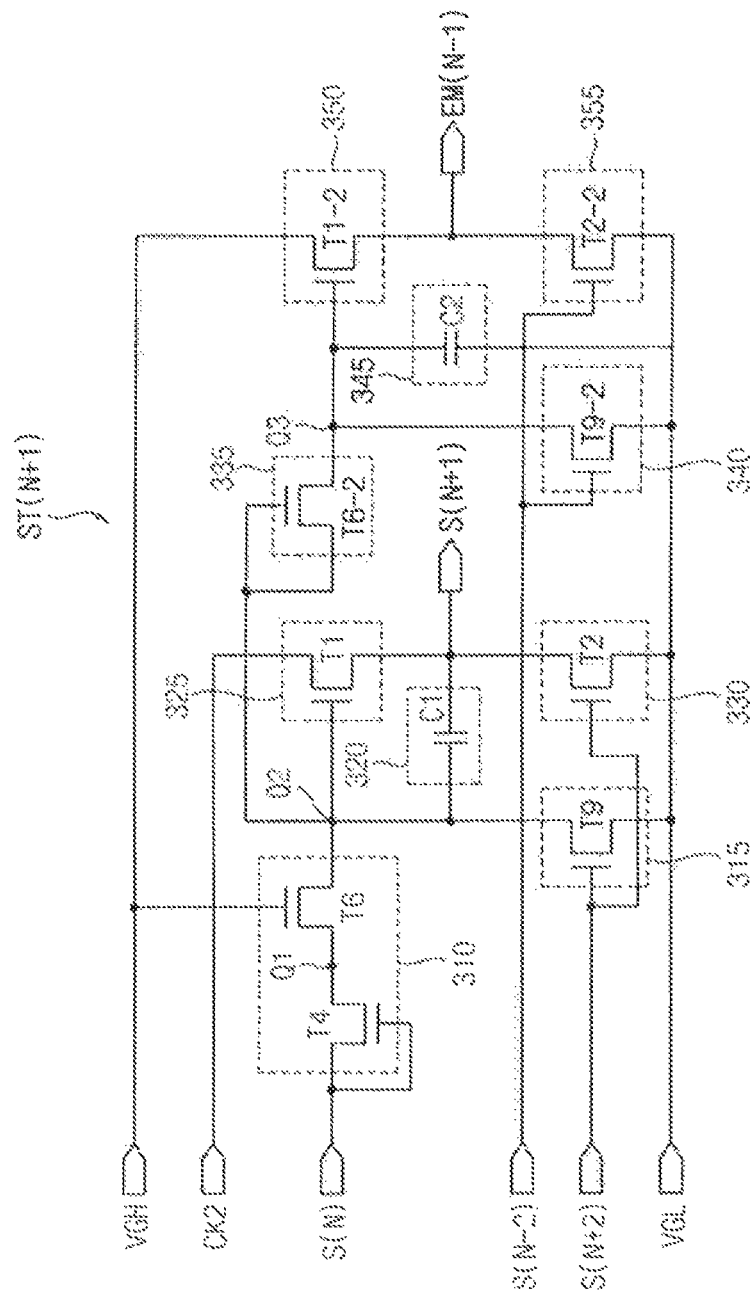
FIG. 6 is a circuit diagram illustrating an (N+1)-th stage of the first driver of FIG. 1 according to an exemplary embodiment of the inventive concept.

FIG. 4 is a circuit diagram illustrating the N-th stage ST(N) of the first driver 300 of FIG. 1 according to an exemplary embodiment of the inventive concept. FIG. 5 is a timing diagram illustrating input signals, control signals, and output signals of the first driver 300 of FIG. 1 according to an exemplary embodiment of the inventive concept. FIG. 6 is a circuit diagram illustrating the (N+1)-th stage ST(N+1) of the first driver 300 of FIG. 1 according to an exemplary embodiment of the inventive concept.

Referring to FIGS. 1 to 6, the first driver 300 may generate the scan signals and the emission signals using a first clock signal CK1, a second clock signal CK2, a first power voltage VGL, and a second power voltage VGH.

For example, a duty ratio of the first clock signal CK1 may be 50% and a duty ratio of the second clock signal CK2 may be 50%. The second clock signal CK2 may be an inverted signal of the first clock signal CK1. For example, the first clock signal CK1 may be applied to the (N−2)-th stage, the N-th stage, and the (N+2)-th stage. The second clock signal CK2 may be applied to the (N−1)-th stage, the (N+1)-th stage, and the (N+3)-th stage. Only one of the first clock signal CK1 and the second clock signal CK2 may be applied to a stage.

The first power voltage VGL may define deactivating levels of the scan signals S(N−3) to S(N+3) and the emission signals EM(N−3) to EM(N+3). The second power voltage VGH may define activating levels of the scan signals S(N−3) to S(N+3) and the emission signals EM(N−3) to EM(N+3). The first power voltage VGL may be less than the second power voltage VGH.

The N-th stage ST(N) may include a first control part 310, a second control part 315, a boosting part 320, a first scan output part 325, a second scan output part 330, a third control part 335, a fourth control part 340, a control signal maintaining part 345, a first emission output part 350, and a second emission output part 355.

The first control part 310 and the second control part 315 generate a scan control signal of a scan control node Q2.

The first control part 310 receives a first previous scan signal, and transmits the first previous scan signal to the scan control node Q2 in response to the first previous scan signal. The first previous scan signal may be one of the scan signals of previous stages. For example, the first previous scan signal may be the (N−1)-th scan signal S(N−1) outputted from the (N−1)-th stage ST(N−1).

The first control part 310 may include a first control switching element T4 and a second control switching element T6. The first control switching element T4 may include a control electrode to which the first previous scan signal S(N−1) is applied, an input electrode to which the first previous scan signal S(N−1) is applied, and an output electrode connected to an input electrode of the second control switching element T6. The second control switching element T6 may include a control electrode to which the second power voltage VGH is applied, an input electrode connected to the output electrode of the first control switching element T4, and an output electrode connected to the scan control node Q2.

The second control part 315 receives a next scan signal, and transmits the first power voltage VGL to the scan control node Q2 in response to the next scan signal. The next scan signal may be one of the scan signals of subsequent stages. For example, the next scan signal may be the (N+1)-th scan signal S(N+1) outputted from the (N+1)-th stage ST(N+1).

The second control part 315 may include a third control switching element T9. The third control switching element T9 may include a control electrode to which the next scan signal S(N+1) is applied, an input electrode connected to the first power voltage VGL, and an output electrode connected to the scan control node Q2.

The boosting part 320 bootstraps the scan control signal of the scan control node Q2. The boosting part 320 may include a first capacitor C1. The first capacitor C1 may include a first electrode connected to the scan control node Q2 and a second electrode connected to a scan output node.

The first scan output part 325 transmits the first clock signal CK1 to the scan output node in response to the scan control signal of the scan control node Q2. The first scan output part 325 may include a first scan output switching element T1. The first scan output switching element T1 may include a control electrode connected to the scan control node Q2, an input electrode to which the first clock signal CK1 is applied, and an output electrode connected to the scan output node. The first scan output part 325 may be a scan pull-up part to pull up the scan signal S(N).

The second scan output part 330 transmits the first power voltage VGL to the scan output node in response to the next scan signal S(N+1). The second scan output part 330 may include a second scan output switching element T2. The second scan output switching element T2 may include a control electrode to which the next scan signal S(N+1) is applied, an input electrode to which the first power voltage VGL is applied, and an output electrode connected to the scan output node. The second scan output part 330 may be a scan pull-down part to pull down the scan signal S(N).

The third control part 335 transmits the scan control signal to an emission control node Q3 in response to the scan control signal. The third control part 335 may include a fourth control switching element T6-2. The fourth control switching element T6-2 may include a control electrode connected to the scan control node Q2, an input electrode connected to the scan control node Q2, and an output electrode connected to the emission control node Q3.

The fourth control part 340 receives a second previous scan signal, and transmits the first power voltage VGL to the emission control node Q3 in response to the second previous scan signal. The second previous scan signal may be one of the scan signals of previous stages. The second previous scan signal may be different from the first previous scan signal S(N−1).

In the present exemplary embodiment, the second previous scan signal may be the (N−3)-th scan signal S(N−3) outputted from the (N−3)-th stage ST(N−3).

The fourth control part 340 may include a fifth control switching element T9-2. The fifth control switching element T9-2 includes a control electrode to which the second previous scan signal S(N−3) is applied, an input electrode to which the first power voltage VGL is applied, and an output electrode connected to the emission control node Q3.

The control signal maintaining part 345 maintains a level of an emission control signal of the emission control node Q3. The control signal maintaining part 345 may include a second capacitor C2. The second capacitor C2 includes a first electrode connected to the emission control node Q3 and a second electrode to which the first power voltage VGL is applied.

The first emission output part 350 transmits the second power voltage VGH to an emission output node in response to the emission control signal of the emission control node Q3. The first emission output part 350 may include a first emission output switching element T1-2. The first emission output switching element T1-2 may include a control electrode connected to the emission control node Q3, an input electrode to which the second power voltage VGH is applied, and an output electrode connected to the emission output node. The first emission output part 350 may be an emission pull-up part to pull up the emission signal EM(N−2).

The second emission output part 355 transmits the first power voltage VGL to the emission output node in response to the second previous scan signal S(N−3). The second emission output part 355 may include a second emission output switching element T2-2. The second emission output switching element T2-2 may include a control electrode to which the second previous scan signal S(N−3) is applied, an input electrode to which the first power voltage VGL is applied, and an output electrode connected to the emission output node. The second emission output part 355 may be an emission pull-down part to pull down the emission signal EM(N−2).

Hereinafter, the operation of the N-th stage ST(N) of the first driver 300 is explained with reference to FIG. 5. When the first previous scan signal S(N−1) is applied to the control electrode and the input electrode of the first control switching element T4, a high pulse of the first previous scan signal S(N−1) is transmitted to a first node Q1. The second power voltage VGH having a high level is applied to the control electrode of the second control switching element T6 so that the signal of the first node Q1 is applied to the scan control node Q2.

The scan control signal of the scan control node Q2 is bootstrapped by the boosting part 320. The scan control signal is applied to the first scan output switching element T1 so that the first scan output switching element T1 is turned on. A high pulse of the first clock signal CK1 is applied to the scan output node so that the scan signal S(N) is pulled up.

When a high pulse of the next scan signal S(N+1) is applied to the control electrodes of the third control switching element T9 and the second scan output switching element T2, the third control switching element T9 and the second scan output switching element T2 are turned on. When the third control switching element T9 is turned on, the first power voltage VGL is applied to the scan control node Q2 so that the first scan output switching element T1 is turned off. When the second scan output switching element T2 is turned on, the first power voltage VGL is applied to the scan output node so that the scan signal S(N) is pulled down.

When the scan control signal of the scan control node Q2 is applied to the control electrode and the input electrode of the fourth control switching element T6-2, the high level of the scan control signal is transmitted to the emission control node Q3. The level of the emission control signal of the emission control node Q3 is sufficiently increased by the second capacitor C2.

When the emission control signal is applied to the first emission output switching element T1-2, the first emission output switching element T1-2 transmits the second power voltage VGH to the emission output node so that the emission signal EM(N−2) is pulled up. The emission signal EM(N−2) maintains the high level until the next frame.

In the next frame, when the high pulse of the second previous scan signal S(N−3) is applied to the control electrodes of the fifth control switching element T9-2 and the second emission output switching element T2-2, the fifth control switching element T9-2 and the second emission output switching element T2-2 are turned on. When the fifth control switching element T9-2 is turned on, the first power voltage VGL is applied to the emission control node Q3 so that the first emission output switching element T1-2 is turned off. When the second emission output switching element T2-2 is turned on, the first power voltage VGL is applied to the emission output node so that the emission signal EM(N−2) is pulled down.

FIG. 6 is a circuit diagram of the (N+1)-th stage which is the next stage after the N-th stage.

Referring to FIG. 6, the (N+1)-th stage ST(N+1) may include the first control part 310, the second control part 315, the boosting part 320, the first scan output part 325, the second scan output part 330, the third control part 335, the fourth control part 340, the control signal maintaining part 345, the first emission output part 350, and the second emission output part 355.

The first clock signal CK1 may be applied to the N-th stage ST(N) and the second clock signal CK2 may be applied to the (N+1)-th stage ST(N+1). Although not shown in the figures, the first clock signal CK1 may be further applied to the (N+2)-th stage ST(N+2) and the second clock signal CK2 may be further applied to the (N+3)-th stage ST(N+3), and so on.

For example, the (N+1)-th stage ST(N+1) may generate the (N+1)-th scan signal S(N+1) and the (N−1)-th emission signal EM(N−1) based on the N-th scan signal S(N), the (N−2)-th scan signal S(N−2), the (N+2)-th scan signal S(N+2), the second clock signal CK2, the first power voltage VGL, and the second power voltage VGH.

Although not shown in the figures, the (N+2)-th stage ST(N+2) may generate the (N+2)-th scan signal S(N+2) and the N-th emission signal EM(N) based on the (N+1)-th scan signal S(N+1), the (N−1)-th scan signal S(N−1), the (N+3)-th scan signal S(N+3), the first clock signal CK1, the first power voltage VGL, and the second power voltage VGH.

The switching elements of the first driver 300 may be N-type transistors. Although the switching elements of the first driver 300 are N-type transistors in the present exemplary embodiment, the inventive concept is not limited thereto. Alternatively, the switching elements of the first driver 300 may be P-type transistors.

According to the present exemplary embodiment, a single stage (e.g., ST(N)) of the first driver 300 may generate the scan signal (e.g., S(N)) and the emission signal (e.g., EM(N−2)) synchronized with each other based on a single clock signal (e.g., CK1), the first power voltage VGL, and the second power voltage VGH. Thus, the number of transistors and the number of capacitors are reduced in the circuit of the first driver 300 for generating the scan signal and the emission signal. As such, the area of dead space in the display panel 100 occupied by the first driver 300 may be reduced.

In addition, as a result of reducing the number of transistors and the number of capacitors, the power consumption of the scan driving circuit may be decreased and the manufacturing cost of the display apparatus may be decreased.

Furthermore, by using the single clock signal to generate the scan signal and the emission signal, the number of signal wirings and the area occupied by the signal wirings may be decreased.

Figure 7:
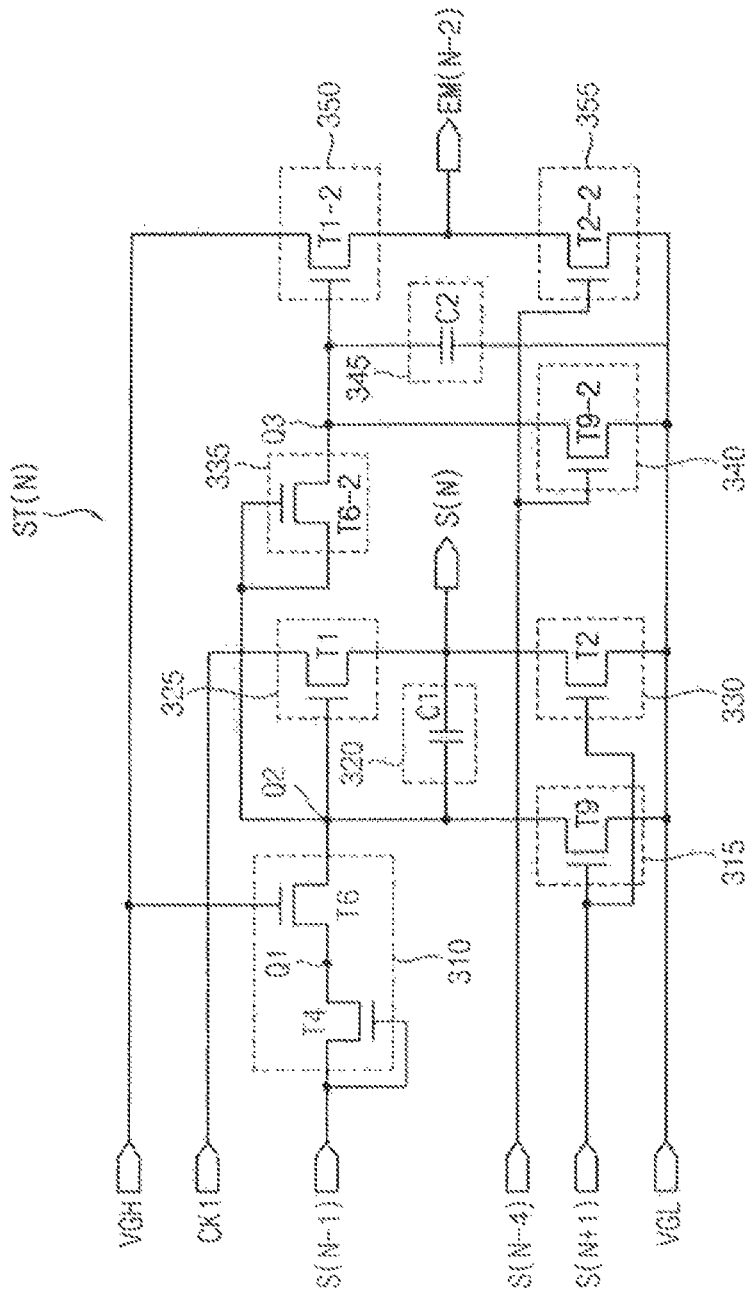
FIG. 7 is a circuit diagram illustrating an N-th stage of a first driver according to an exemplary embodiment of the inventive concept.
Figure 8:
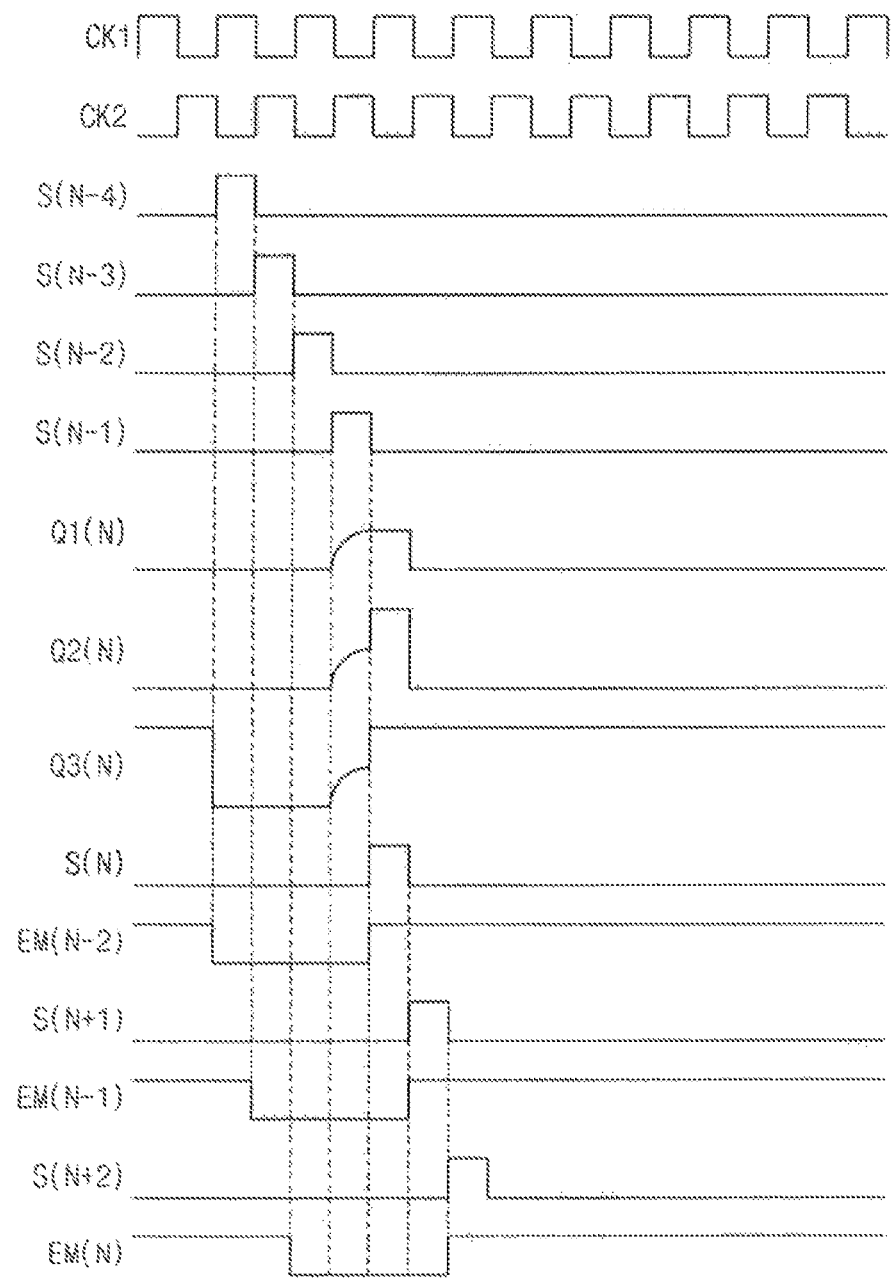
FIG. 8 is a timing diagram illustrating input signals, control signals, and output signals of the first driver of FIG. 7 according to an exemplary embodiment of the inventive concept.

FIG. 7 is a circuit diagram illustrating the N-th stage ST(N) of the first driver 300 according to an exemplary embodiment of the inventive concept. FIG. 8 is a timing diagram illustrating input signals, control signals, and output signals of the first driver 300 of FIG. 7 according to an exemplary embodiment of the inventive concept.

The first driver 300 and the display apparatus including the first driver 300 according to the present exemplary embodiment is substantially the same as the first driver 300 and the display apparatus including the first driver 300 described with reference to FIGS. 1 to 6, except that the N-th stage ST(N) receives an (N−4)-th scan signal outputted from an (N−4)-th stage. Thus, the same reference numerals will be used to refer to the same or like parts as those described in the exemplary embodiment of FIGS. 1 to 6 and any repetitive explanations concerning these elements will be omitted.

Referring to FIGS. 1, 2, 7, and 8, the display apparatus includes the display panel 100, the timing controller 200, the first driver 300, the second driver 400, and the power generating unit 500.

The first driver 300 may generate the scan signals and the emission signals using the first clock signal CK1, the second clock signal CK2, the first power voltage VGL, and the second power voltage VGH.

The N-th stage ST(N) may include the first control part 310, the second control part 315, the boosting part 320, the first scan output part 325, the second scan output part 330, the third control part 335, the fourth control part 340, the control signal maintaining part 345, the first emission output part 350 and the second emission output part 355.

The first control part 310 receives a first previous scan signal, and transmits the first previous scan signal to the scan control node Q2 in response to the first previous scan signal. The first previous scan signal may be one of the scan signals of previous stages. For example, the first previous scan signal may be the (N−1)-th scan signal S(N−1) outputted from the (N−1)-th stage ST(N−1).

The second control part 315 receives a next scan signal, and transmits the first power voltage VGL to the scan control node Q2 in response to the next scan signal. The next scan signal may be one of the scan signals of subsequent stages. For example, the next scan signal may be the (N+1)-th scan signal S(N+1) outputted from the (N+1)-th stage ST(N+1).

The boosting part 320 bootstraps the scan control signal of the scan control node Q2. The boosting part 320 may include the first capacitor C1.

The first scan output part 325 transmits the first clock signal CK1 to the scan output node in response to the scan control signal of the scan control node Q2.

The second scan output part 330 transmits the first power voltage VGL to the scan output node in response to the next scan signal S(N+1).

The third control part 335 transmits the scan control signal to the emission control node Q3 in response to the scan control signal.

The fourth control part 340 receives a second previous scan signal, and transmits the first power voltage VGL to the emission control node Q3 in response to the second previous scan signal. The second previous scan signal may be one of the scan signals of previous stages. The second previous scan signal may be different from the first previous scan signal S(N−1).

In the present exemplary embodiment, the second previous scan signal may be the (N−4)-th scan signal S(N−4) outputted from the (N−4)-th stage ST(N−4).

The fourth control part 340 may include the fifth control switching element T9-2. The fifth control switching element T9-2 includes a control electrode to which the second previous scan signal S(N−4) is applied, an input electrode to which the first power voltage VGL is applied, and an output electrode connected to the emission control node Q3.

The control signal maintaining part 345 maintains a level of the emission control signal of the emission control node Q3. The control signal maintaining part 345 may include the second capacitor C2.

The first emission output part 350 transmits the second power voltage VGH to the emission output node in response to the emission control signal of the emission control node Q3.

The second emission output part 355 transmits the first power voltage VGL to the emission output node in response to the second previous scan signal S(N−4). The second emission output part 355 may include the second emission output switching element T2-2. The second emission output switching element T2-2 may include a control electrode to which the second previous scan signal S(N−4) is applied, an input electrode to which the first power voltage VGL is applied, and an output electrode connected to the emission output node. The second emission output part 355 may be an emission pull-down part to pull down the emission signal EM(N−2).

According to the present exemplary embodiment, a single stage (e.g., ST(N)) of the first driver 300 may generate the scan signal (e.g., S(N)) and the emission signal (e.g., EM(N−2)) synchronized with each other based on a single clock signal (e.g., CK1), the first power voltage VGL, and the second power voltage VGH. Thus, the number of transistors and the number of capacitors in the circuit of the first driver 300 for generating the scan signal and the emission signal are reduced. As such, the area of dead space in the display panel 100 occupied by the first driver 300 may be reduced.

In addition, by reducing the number of transistors and the number of capacitors, power consumption of the scan driving circuit may be decreased and manufacturing cost of the display apparatus may be decreased.

In addition, because the scan signal and the emission signal are generated using the single clock signal, the number of signal wirings and the area occupied by the signal wirings may be decreased.

Figure 9:
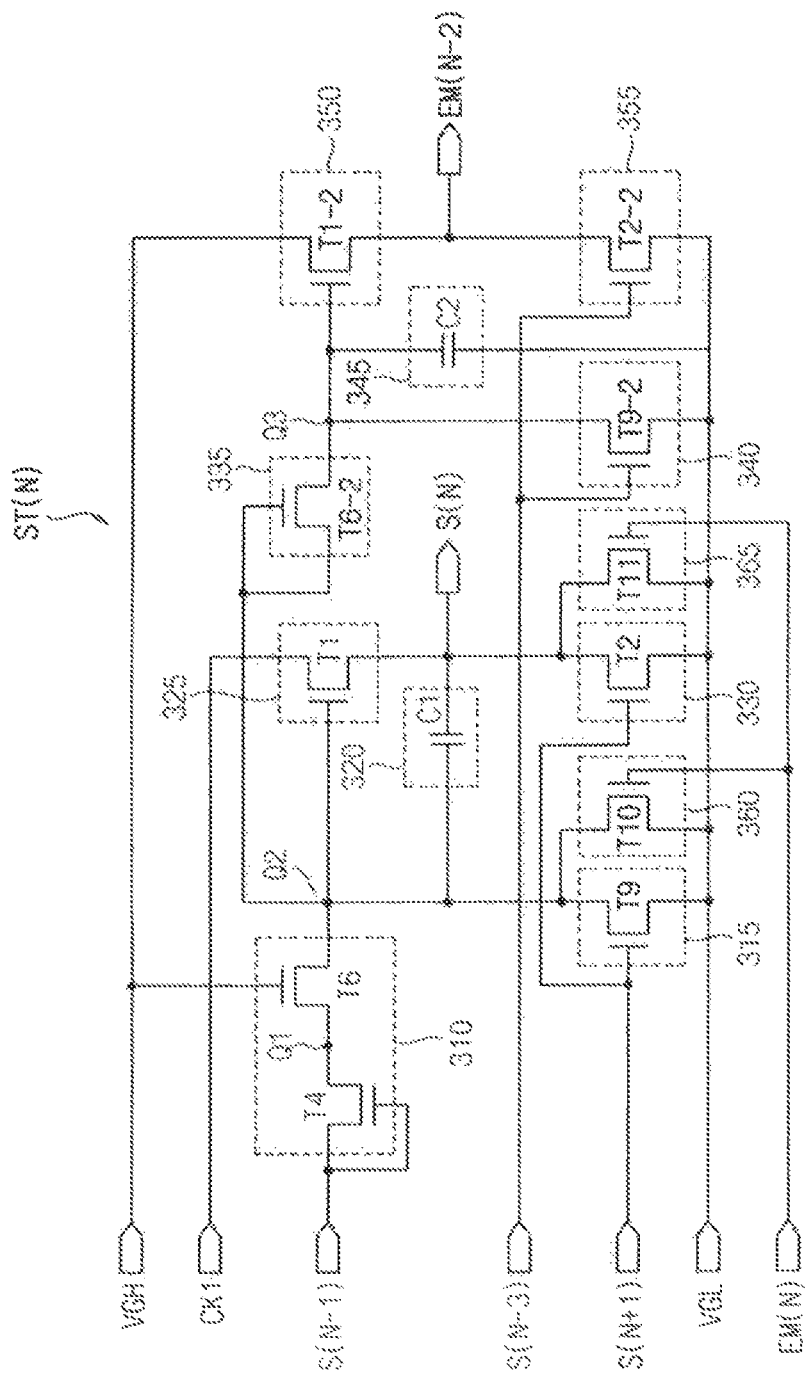
FIG. 9 is a circuit diagram illustrating an N-th stage of a first driver according to an exemplary embodiment of the inventive concept.

FIG. 9 is a circuit diagram illustrating the N-th stage ST(N) of the first driver 300 according to an exemplary embodiment of the inventive concept.

The first driver 300 and the display apparatus including the first driver 300 according to the present exemplary embodiment is substantially the same as the first driver 300 and the display apparatus including the first driver 300 described with reference to FIGS. 1 to 6, except that the N-th stage ST(N) further includes a first holding part and a second holding part. Thus, the same reference numerals will be used to refer to the same or like parts as those described in the exemplary embodiments of FIGS. 1 to 6 and any repetitive explanations concerning the above elements will be omitted.

Referring to FIGS. 1, 2, and 9, the display apparatus includes the display panel 100, the timing controller 200, the first driver 300, the second driver 400, and the power generating unit 500.

The first driver 300 may generate the scan signals and the emission signals using the first clock signal CK1, the second clock signal CK2, the first power voltage VGL, and the second power voltage VGH.

The N-th stage ST(N) may include the first control part 310, the second control part 315, the boosting part 320, the first scan output part 325, the second scan output part 330, the third control part 335, the fourth control part 340, the control signal maintaining part 345, the first emission output part 350, and the second emission output part 355.

The N-th stage ST(N) may further include a first holding part 360 and a second holding part 365.

The first control part 310 receives a first previous scan signal, and transmits the first previous scan signal to the scan control node Q2 in response to the first previous scan signal. The first previous scan signal may be one of the scan signals of previous stages. For example, the first previous scan signal may be the (N−1)-th scan signal S(N−1) outputted from the (N−1)-th stage ST(N−1).

The second control part 315 receives a next scan signal, and transmits the first power voltage VGL to the scan control node Q2 in response to the next scan signal. The next scan signal may be one of the scan signals of subsequent stages. For example, the next scan signal may be the (N+1)-th scan signal S(N+1) outputted from the (N+1)-th stage ST(N+1).

The boosting part 320 bootstraps the scan control signal of the scan control node Q2. The boosting part 320 may include the first capacitor C1.

The first scan output part 325 transmits the first clock signal CK1 to the scan output node in response to the scan control signal of the scan control node Q2.

The second scan output part 330 transmits the first power voltage VGL to the scan output node in response to the next scan signal S(N+1).

The third control part 335 transmits the scan control signal to the emission control node Q3 in response to the scan control signal.

The fourth control part 340 receives a second previous scan signal, and transmits the first power voltage VGL to the emission control node Q3 in response to the second previous scan signal. The second previous scan signal may be one of the scan signals of previous stages. The second previous scan signal may be different from the first previous scan signal S(N−1).

In the present exemplary embodiment, the second previous scan signal may be the (N−3)-th scan signal S(N−3) outputted from the (N−3)-th stage ST(N−3).

The control signal maintaining part 345 maintains a level of the emission control signal of the emission control node Q3. The control signal maintaining part 345 may include the second capacitor C2.

The first emission output part 350 transmits the second power voltage VGH to the emission output node in response to the emission control signal of the emission control node Q3.

The second emission output part 355 transmits the first power voltage VGL to the emission output node in response to the second previous scan signal S(N−3).

The first holding part 360 transmits the first power voltage VGL to the scan control node Q2 in response to a next emission signal. The next emission signal may be one of the emission signals outputted from subsequent stages. The first holding part 360 sets and maintains the scan control signal at the level of the first power voltage VGL in response to the next emission signal.

For example, the next emission signal may be the emission signal EM(N) outputted from the (N+2)-th stage ST(N+2). As shown in FIG. 2, the emission signal EM(N) outputted from the (N+2)-th stage ST(N+2) is outputted to the N-th pixel row P(N). Alternatively, the next emission signal may be one of the emission signals EM(N+1), EM(N+2), EM(N+3), etc. outputted from one of the stages ST(N+3), ST(N+4), ST(N+5), etc., respectively, after the (N+2)-th stage ST(N+2).

The first holding part 360 may include a first holding switching element T10. The first holding switching element T10 may include a control electrode to which the next emission signal EM(N) is applied, an input electrode to which the first power voltage VGL is applied, and an output electrode connected to the scan control node.

The second holding part 365 transmits the first power voltage VGL to the scan output node in response to the next emission signal EM(N). The second holding part 365 sets and maintains the scan signal S(N) at the level of the first power voltage VGL in response to the next emission signal EM(N).

The second holding part 365 may include a second holding switching element T11. The second holding switching element T11 may include a control electrode to which the next emission signal EM(N) is applied, an input electrode to which the first power voltage VGL is applied, and an output electrode connected to the scan output node.

According to the present exemplary embodiment, a single stage (e.g., ST(N)) of the first driver 300 may generate the scan signal (e.g., S(N)) and the emission signal (e.g., EM(N−2)) synchronized with each other based on a single clock signal (e.g., CK1), the first power voltage VGL, and the second power voltage VGH. Thus, the number of transistors and the number of capacitors in the circuit of the first driver 300 for generating the scan signal and the emission signal are reduced. As such, the area of dead space in the display panel 100 occupied by the first driver 300 may be reduced.

In addition, by reducing the number of transistors and the number of capacitors, power consumption of the scan driving circuit may be decreased and manufacturing cost of the display apparatus may be decreased.

Moreover, because the scan signal and the emission signal are generated using the single clock signal, the number of signal wirings and the area occupied by the signal wirings may be decreased.

Figure 10:
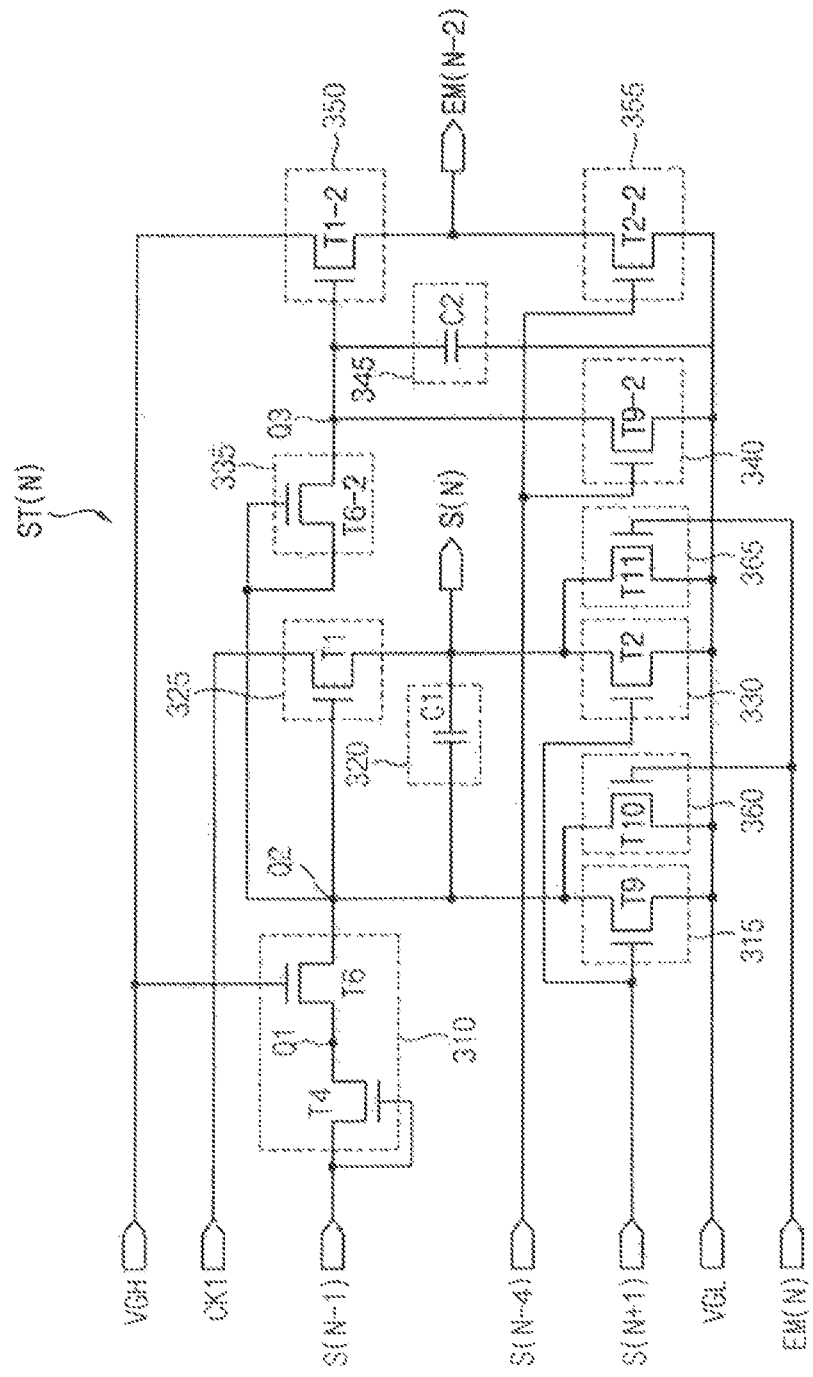
FIG. 10 is a circuit diagram illustrating an N-th stage of a first driver according to an exemplary embodiment of the inventive concept.

FIG. 10 is a circuit diagram illustrating the N-th stage ST(N) of the first driver 300 according to an exemplary embodiment of the inventive concept.

The first driver 300 and the display apparatus including the first driver 300 according to the present exemplary embodiment is substantially the same as the first driver 300 and the display apparatus including the first driver 300 described with reference to FIG. 9, except that the N-th stage ST(N) receives an (N−4)-th scan signal outputted from the (N−4)-th stage. Thus, the same reference numerals will be used to refer to the same or like parts as those described in the exemplary embodiment of FIG. 9 and any repetitive explanations concerning the above elements will be omitted.

Referring to FIGS. 1, 2, and 10, the display apparatus includes the display panel 100, the timing controller 200, the first driver 300, the second driver 400, and the power generating unit 500.

The first driver 300 may generate the scan signals and the emission signals using the first clock signal CK1, the second clock signal CK2, the first power voltage VGL, and the second power voltage VGH.

The N-th stage ST(N) may include the first control part 310, the second control part 315, the boosting part 320, the first scan output part 325, the second scan output part 330, the third control part 335, the fourth control part 340, the control signal maintaining part 345, the first emission output part 350, and the second emission output part 355.

The N-th stage ST(N) may further include the first holding part 360 and the second holding part 365.

The first control part 310 receives a first previous scan signal, and transmits the first previous scan signal to the scan control node Q2 in response to the first previous scan signal. The first previous scan signal may be one of the scan signals of previous stages. For example, the first previous scan signal may be the (N−1)-th scan signal S(N−1) outputted from the (N−1)-th stage ST(N−1).

The second control part 315 receives a next scan signal, and transmits the first power voltage VGL to the scan control node Q2 in response to the next scan signal. The next scan signal may be one of the scan signals of subsequent stages. For example, the next scan signal may be the (N+1)-th scan signal S(N+1) outputted from the (N+1)-th stage ST(N+1).

The boosting part 320 bootstraps the scan control signal of the scan control node Q2. The boosting part 320 may include the first capacitor C1.

The first scan output part 325 transmits the first clock signal CK1 to the scan output node in response to the scan control signal of the scan control node Q2.

The second scan output part 330 transmits the first power voltage VGL to the scan output node in response to the next scan signal S(N+1).

The third control part 335 transmits the scan control signal to the emission control node Q3 in response to the scan control signal.

The fourth control part 340 receives a second previous scan signal, and transmits the first power voltage VGL to the emission control node Q3 in response to the second previous scan signal. The second previous scan signal may be one of the scan signals of previous stages. The second previous scan signal may be different from the first previous scan signal S(N−1).

In the present exemplary embodiment, the second previous scan signal may be the (N−4)-th scan signal S(N−4) outputted from the (N−4)-th stage ST(N−4).

The control signal maintaining part 345 maintains a level of the emission control signal of the emission control node Q3. The control signal maintaining part 345 may include the second capacitor C2.

The first emission output part 350 transmits the second power voltage VGH to the emission output node in response to the emission control signal of the emission control node Q3.

The second emission output part 355 transmits the first power voltage VGL to the emission output node in response to the second previous scan signal S(N−4).

The first holding part 360 transmits the first power voltage VGL to the scan control node Q2 in response to a next emission signal. The next emission signal may be one of the emission signals outputted from subsequent stages, e.g., the emission signal EM(N). The first holding part 360 sets and maintains the scan control signal at the level of the first power voltage VGL in response to the next emission signal EM(N).

The second holding part 365 transmits the first power voltage VGL to the scan output node in response to the next emission signal EM(N). The second holding part 365 sets and maintains the scan signal S(N) at the level of the first power voltage VGL in response to the next emission signal EM(N).

According to the present exemplary embodiment, a single stage (e.g., ST(N)) of the first driver 300 may generate the scan signal (e.g., S(N)) and the emission signal (e.g., EM(N−2)) synchronized with each other based on a single clock signal (e.g., CK1), the first power voltage VGL, and the second power voltage VGH. Thus, the number of transistors and the number of capacitors in the circuit of the first driver 300 for generating the scan signal and the emission signal are reduced. As such, the area of dead space in the display panel 100 occupied by the first driver 300 may be reduced.

In addition, by reducing the number of transistors and the number of capacitors, power consumption of the scan driving circuit may be decreased and manufacturing cost of the display apparatus may be decreased.

Furthermore, because the scan signal and the emission signal are generated using the single clock signal, the number of signal wirings and the area occupied by the signal wirings may be decreased.

The inventive concept explained above may be applied to all systems that include a display apparatus. For example, the inventive concept may be applied to a television, a monitor, a laptop computer, a digital camera, a cellular phone, a smart phone, a personal digital assistant (PDA), a portable multimedia player (PMP), an MP3 player, a navigation system, a videophone, etc.

In the display panel driver and the display apparatus including the display panel driver described in the exemplary embodiments above, a stage of the display panel driver may output a scan signal and an emission signal synchronized with each other based on a clock signal, a first power voltage, and a second power voltage. Thus, the number of transistors and capacitors for outputting the scan signal and the emission signal may be reduced. As such, the area of dead space in the display panel occupied by the display panel driver may be reduced.

In addition, by reducing the number of transistors and capacitors for outputting the scan signal and the emission signal, power consumption of the driving circuit may be reduced and manufacturing cost of the display apparatus may be reduced.

Moreover, because the scan signal and the emission signal are generated using only one clock signal, the number of signal lines and the area occupied by the signal lines may be reduced.

While the inventive concept has been shown and described with reference to the exemplary embodiments thereof, it will be understood by those of ordinary skill in the art that various changes in form and details may be made thereto without departing from the spirit and scope of the present inventive concept as defined by the following claims.

What is claimed is:

1. A display panel driver comprising a plurality of stage circuits,
   wherein an N-th stage circuit of the plurality of stage circuits is configured to output a scan signal and an emission signal synchronized with each other based on a first power voltage, a second power voltage, and at least one clock signal,
   wherein the scan signal of the N-th stage circuit is outputted to a first pixel row through a scan line directly connected between the N-th stage circuit and a pixel in the first pixel row, and the emission signal of the N-th stage circuit is outputted to a second pixel row different from the first pixel row through an emission line directly connected between the N-th stage circuit and a pixel in the second pixel row, and
   wherein N is a natural number.

2. The display panel driver of claim 1, wherein
   the display panel driver is connected to a display panel comprising a plurality of pixel rows,
   the scan signal of the N-th stage circuit is an N-th scan signal to drive an N-th pixel row, and
   the emission signal of the N-th stage circuit is a previous emission signal to drive one of previous pixel rows with respect to the N-th pixel row.

3. The display panel driver of claim 2, wherein the previous emission signal is an (N−2)-th emission signal to drive an (N−2)-th pixel row.

4. The display panel driver of claim 1, wherein the N-th stage circuit comprises:
   a first control circuit configured to transmit a first previous scan signal to a scan control node in response to the first previous scan signal, wherein the first previous scan signal is outputted from one of previous stage circuits with respect to the N-th stage circuit;
   a second control circuit configured to transmit the first power voltage to the scan control node in response to a next scan signal, wherein the next scan signal is outputted from one of subsequent stage circuits with respect to the N-th stage circuit;
   a first scan output circuit configured to transmit the at least one clock signal to a scan output node in response to a scan control signal of the scan control node;
   a second scan output circuit configured to transmit the first power voltage to the scan output node in response to the next scan signal;
   a third control circuit configured to transmit the scan control signal to an emission control node in response to the scan control signal;
   a fourth control circuit configured to transmit the first power voltage to the emission control node in response to a second previous scan signal, wherein the second previous scan signal is outputted from one of the previous stage circuits with respect to the N-th stage circuit and is different from the first previous scan signal;
   a first emission output circuit configured to transmit the second power voltage to an emission output node in response to an emission control signal of the emission control node; and
   a second emission output circuit configured to transmit the first power voltage to the emission output node in response to the second previous scan signal.

5. The display panel driver of claim 4, wherein the first control circuit comprises a first control switching element and a second control switching element,
   wherein the first control switching element comprises:
   a control electrode and an input electrode to which the first previous scan signal is applied; and
   an output electrode connected to an input electrode of the second control switching element, and
   wherein the second control switching element comprises:
   a control electrode to which the second power voltage is applied;
   the input electrode connected to the output electrode of the first control switching element; and
   an output electrode connected to the scan control node.

6. The display panel driver of claim 4, wherein the N-th stage circuit further comprises a first capacitor comprising a first electrode connected to the scan control node and a second electrode connected to the scan output node.

7. The display panel driver of claim 4, wherein the N-th stage circuit further comprises a second capacitor comprising a first electrode connected to the emission control node and a second electrode to which the first power voltage is applied.

8. The display panel driver of claim 4, wherein the second previous scan signal is an (N−3)-th scan signal outputted from an (N−3)-th stage circuit.

9. The display panel driver of claim 4, wherein the second previous scan signal is an (N−4)-th scan signal outputted from an (N−4)-th stage circuit.

10. The display panel driver of claim 4, wherein the N-th stage circuit further comprises a first holding circuit configured to transmit the first power voltage to the scan control node in response to a next emission signal, and
    the next emission signal is outputted from one of the subsequent stage circuits with respect to the N-th stage circuit.

11. The display panel driver of claim 10, wherein the next emission signal is an (N+2)-th emission signal outputted from an (N+2)-th stage circuit.

12. The display panel driver of claim 4, wherein the N-th stage circuit further comprises a second holding circuit configured to transmit the first power voltage to the scan output node in response to a next emission signal, and
    the next emission signal is outputted from one of the subsequent stage circuits with respect to the N-th stage circuit.

13. The display panel driver of claim 12, wherein the next emission signal is an (N-+2)-th emission signal outputted from an (N+2)-th stage circuit.

14. The display panel driver of claim 4, wherein the first scan output circuit comprises a first scan output switching element comprising a control electrode connected to the scan control node, an input electrode to which the at least one clock signal is applied, and an output electrode connected to the scan output node.

15. The display panel driver of claim 14, wherein the second scan output circuit comprises a second scan output switching element comprising a control electrode to which the next scan signal is applied, an input electrode to which the first power voltage is applied, and an output electrode connected to the scan output node.

16. The display panel driver of claim 4, wherein the first emission output circuit comprises a first emission output switching element comprising a control electrode connected to the emission control node, an input electrode to which the second power voltage is applied, and an output electrode connected to the emission output node.

17. The display panel driver of claim 16, wherein the second emission output circuit comprises a second emission output switching element comprising a control electrode to which the second previous scan signal is applied, an input electrode to which the first power voltage is applied, and an output electrode connected to the emission output node.

18. A display apparatus comprising:
a display panel configured to display an image;
a first driver circuit comprising a plurality of stage circuits and configured to output a scan signal and an emission signal to the display panel; and
a second driver circuit configured to output a data voltage to the display panel, wherein an N-th stage circuit of the plurality of stage circuits of the first driver circuit is configured to output the scan signal and the emission signal synchronized with each other based on a first power voltage, a second power voltage, and at least one clock signal,
wherein the scan signal of the N-th stage circuit is outputted to a first pixel row through a scan line directly connected between the N-th stage circuit and a pixel in the first pixel row, and the emission signal of the N-th stage circuit is outputted to a second pixel row different from the first pixel row through an emission line directly connected between the N-th stage circuit and a pixel in the second pixel row, and
wherein N is a natural number.

19. The display apparatus of claim 18, wherein
the display panel comprises a plurality of pixel rows, and
the scan signal of the N-th stage circuit is an N-th scan signal to drive an N-th pixel row, and
the emission signal of the N-th stage circuit is a previous emission signal to drive one of previous pixel rows with respect to the N-th pixel row.

20. A method of driving a display panel, comprising a plurality of pixel rows, using a display panel driver, comprising a plurality of stages, the method comprising:
applying a clock signal and a power voltage;
generating a scan control signal in response to the power voltage and a first scan signal that is outputted from an (N−1)-th stage circuit;
transmitting the clock signal, in response to the scan control signal, to a scan output node, wherein a high pulse of the clock signal pulls up a second scan signal of an N-th stage circuit;
outputting the second scan signal;
generating an emission control signal in response to the scan control signal;
transmitting the power voltage, in response to the emission control signal, to an emission output node to pull up an emission signal; and
outputting the emission signal,
wherein N is a natural number, and
the second scan signal drives an N-th pixel row and the emission signal drives an (N−2)-th pixel row.

* * * * *